US007663682B2

(12) United States Patent
Misawa (10) Patent No.: US 7,663,682 B2
(45) Date of Patent: Feb. 16, 2010

(54) VARIABLE SENSITIVITY IMAGING DEVICE INCLUDING A VOLTAGE APPLYING SECTION, AND IMAGING APPARATUS INCLUDING THE SAME

(75) Inventor: Takeshi Misawa, Saitama (JP)

(73) Assignee: Fujifilm Corporation, Minato-ku, Tokyo (JP)

( * ) Notice: Subject to any disclaimer, the term of this patent is extended or adjusted under 35 U.S.C. 154(b) by 492 days.

(21) Appl. No.: 11/527,393

(22) Filed: Sep. 27, 2006

(65) Prior Publication Data

US 2007/0076093 A1    Apr. 5, 2007

(30) Foreign Application Priority Data

Sep. 30, 2005   (JP)   ............... P2005-288861

(51) Int. Cl.
*H04N 3/14* (2006.01)
*H04N 5/335* (2006.01)
(52) U.S. Cl. ............ 348/308; 348/281; 348/297; 257/233
(58) Field of Classification Search ............... None
See application file for complete search history.

(56) References Cited

U.S. PATENT DOCUMENTS 6,965,102 B1 * 11/2005 Merrill ............ 250/208.1
7,129,466 B2 * 10/2006 Iwasaki ............ 250/214.1
7,541,627 B2 * 6/2009 Hynecek et al. ............ 257/224
7,570,292 B2 * 8/2009 Hioki ............ 348/294
7,582,943 B2 * 9/2009 Fukunaga et al. ............ 257/432
2004/0178466 A1 * 9/2004 Merrill et al. ............ 257/440

FOREIGN PATENT DOCUMENTS

| JP | 58-103165 | 6/1983 |
| JP | 1-300575 | 12/1989 |
| JP | 5-111037 | 4/1993 |
| JP | 5-244609 | 9/1993 |
| JP | 9-148549 | 6/1997 |
| JP | 9-163383 | 6/1997 |
| JP | 2003-332551 | 11/2003 |

* cited by examiner

*Primary Examiner*—Ngoc-Yen T Vu
(74) *Attorney, Agent, or Firm*—McGinn IP Law Group, PLLC (57) ABSTRACT

A variable sensitivity imaging device comprises: a substrate; a photosensitive layer which is stacked above the substrate, and which is interposed between a pixel electrode layer and an opposing electrode layer; a signal reading section, formed on said substrate, that reads a signal corresponding to photo-charges which are generated by incidence of light into the photosensitive layer; and a voltage applying section that applies a voltage for making a sensitivity variable between the pixel electrode layer and the opposing electrode layer.

7 Claims, 9 Drawing Sheets

STRUCTURAL FORMULA
OF QUINACRIDONE

FIG. 6

SPECTRAL SENSITIVITY CHARACTERISTIC
CURVE OF QUINACRIDONE

VARIABLE SENSITIVITY IMAGING DEVICE INCLUDING A VOLTAGE APPLYING SECTION, AND IMAGING APPARATUS INCLUDING THE SAME

BACKGROUND OF THE INVENTION

1. Field of the Invention

The present invention relates to an imaging device and an imaging apparatus, and more particularly to a variable sensitivity imaging device in which the sensitivity is variable, and an imaging apparatus including it.

2. Description of the Related Art

In the related art, several attempts to optimize the sensitivity of an imaging device have been made. In the related-art technique disclosed in JP-A-5-111037, color filters which are disposed on a light receiving portion of a solid-state imaging device are driven by an actuator to enable the color filters to be selected. However, the reference does not concern itself with the sensitivity of the imaging device.

In the related-art technique disclosed in JP-A-5-244609, a material in which the spectral transmittance is changed by an applied voltage is used as a color filter, and the sensitivity can be variably set for each pixel. The sensitivity difference among colors due to the color difference of the color filter can be reduced. However, the technique does not optimize the sensitivity of an imaging device.

In the related-art technique disclosed in JP-A-9-148549, an on-chip lens is formed by a color filter, and, depending on the sensitivity of a pixel for each color, the height of the on-chip lens for the pixel is varied, thereby correcting the sensitivity difference among colors. In the related-art technique disclosed in JP-A-9-163383, a similar effect is attained by adjusting the output gain of an imaging device.

In these imaging devices, strictly speaking, the sensitivity of an imaging device itself is not changed, but the sensitivity is adjusted by the color filter or the on-chip microlens disposed on the front face of the light receiving portion of the imaging device, or an output amplifier. In order to change the sensitivity, therefore, an additional process is required, and there arises a problem on that the production cost is increased.

Furthermore, the technique in which the sensitivity is made variable by the microlens has a problem in that there is no real time property.

The imaging devices of the above-described the related-art techniques have a configuration in which a photodiode is formed in a surface portion of a semiconductor substrate, and photo-charges that are accumulated in the photodiode by incidence of light are read out to the outside of the imaging device by a signal reading section (a charge transfer path in the case of the CCD type, or a MOS transistor circuit in the case of the CMOS type).

As disclosed in JP-A-58-103165, JP-A-1-300575 and JP-A-2003-332551, however, there are imaging devices having a configuration in which photoelectric converting layers such as organic layers are stacked above a semiconductor substrate, and photo-charges are generated in accordance with the amount of incident light, and then read out to the outside of the imaging device. Also in such organic imaging devices, however, there is no device in which the sensitivity of the imaging device itself is changed.

SUMMARY OF THE INVENTION

It is an object of the invention to provide a variable sensitivity imaging device in which photoelectric converting layers such as organic layers are stacked above a semiconductor substrate, and the sensitivity can be adjusted by optimumly adjusting the amount of photo-charges that are generated in the photoelectric converting layers in accordance with the amount of incident light. It is another object of the invention to provide an imaging apparatus which is equipped with the variable sensitivity imaging device.

The variable sensitivity imaging device of the invention comprises: a substrate; a photosensitive layer which is stacked above the substrate, and which is interposed between a pixel electrode layer and an opposing electrode layer; a signal reading section, formed on said substrate, that reads a signal corresponding to photo-charges which are generated by incidence of light into the photosensitive layer; and a voltage applying section that applies a voltage for making a sensitivity variable between the pixel electrode layer and the opposing electrode layer.

According to the invention, there is provided the variable sensitivity imaging device, wherein a plurality sets each comprising the photosensitive layer, and the pixel electrode layer and the opposing electrode layer between which the photosensitive layer is interposed are stacked, and photosensitive layers of the sets have a peak of a photo sensitivity at different wavelength regions.

According to the invention, there is provided the variable sensitivity imaging device, wherein three sets each comprising the photosensitive layer, and the pixel electrode layer and the opposing electrode layer between which the photosensitive layer is interposed are stacked, and first one of the three sets has a photo sensitivity at red light, second one of the three sets has a photo sensitivity at green light, and third one of the three sets has a photo sensitivity at blue light.

According to the invention, there is provided the variable sensitivity imaging device, wherein the substrate is a semiconductor substrate, and the signal reading section comprises: a device having a charge transferring portion that transfers the photo-charges of a pixel at a predetermined position; or a device having a reading mechanism that selectively reads a signal corresponding to the photo-charges of the pixel at the predetermined position.

According to the invention, there is provided the variable sensitivity imaging device, wherein the substrate is flexible.

The imaging apparatus of the invention comprises: the above-mentioned variable sensitivity imaging device; and an applied voltage adjusting section that controls the voltage to be applied between the pixel electrode layer and the opposing electrode layer by the voltage applying section, to adjust an image signal which is output from the variable sensitivity imaging device.

The imaging apparatus of the invention comprises: a variable sensitivity imaging device including three sets each comprising the photosensitive layer, and the pixel electrode layer and the opposing electrode layer between which the photosensitive layer is interposed; and an applied voltage adjusting section that controls the voltage to be applied between the pixel electrode layer and the opposing electrode layer in each of the three sets by the voltage applying section, to adjust image signals of red, green, and blue which are output from the variable sensitivity imaging device, and perform white balance adjustment.

DETAILED DESCRIPTION OF THE INVENTION

Hereinafter, an embodiment of the invention will be described with reference to the accompanying drawings.

Figure 1:
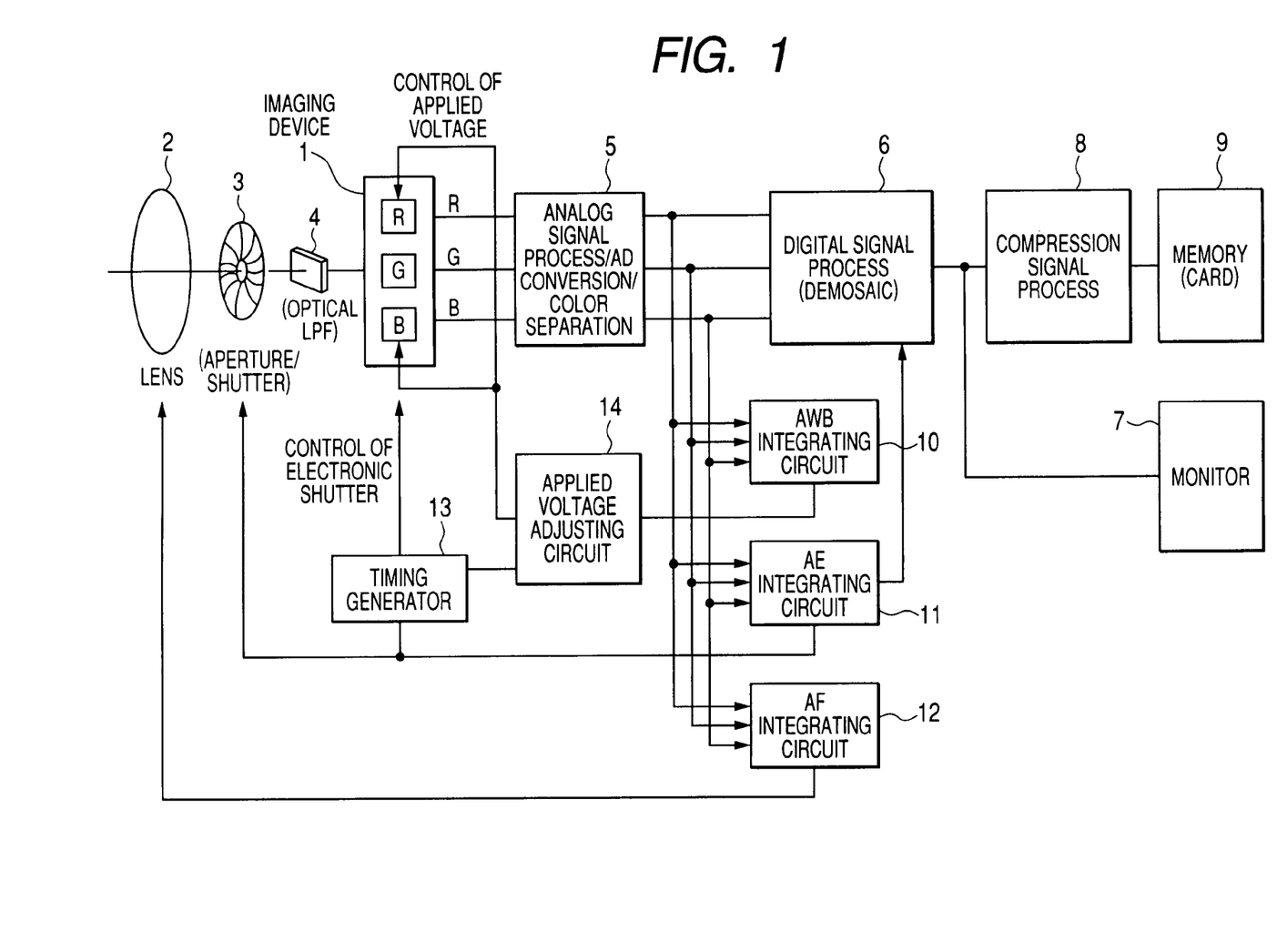
FIG. 1 is a functional block diagram of a digital camera in an embodiment of the invention.

FIG. 1 is a functional block diagram of a digital camera which is an imaging apparatus of an embodiment of the invention. The digital camera of the embodiment which takes a motion picture or a still picture comprises a lens 2, an aperture/shutter 3, and an optical low-pass filter 4 on the light incident side of a variable sensitivity imaging device 1, and further comprises: an analog signal processing circuit 5 which receives image signals of R (red), G (green), and B (blue) constituting imaging data of the variable sensitivity imaging device 1, and which performs an analog process such as a correlation dual sampling process, an A/D conversion process, or a color separation process; a digital signal processing circuit 6 which receives digital image signals that have undergone the analog process, and which performs a signal process such as an RGB/YC conversion process to produce photographed image data; a monitor 7 which displays the photographed image data that have undergone the digital process; an compression signal processing circuit 8 which compresses the photographed image data that have undergone the digital process, to photographed image data of the JPEG format or the like; and a memory card 9 which records the photographed image data that have been compressed.

The digital camera further comprises: an AWB integrating circuit 10 which receives the R, G, and B image signals that are output from the analog signal processing circuit 5, and which integrates the color signals in order to perform an auto white balance (AWB) process; an AE integrating circuit 11 which receives the R, G, and B image signals that are output from the analog signal processing circuit 5, which integrates the color signals in order to perform an automatic exposure (AE) process, which outputs a results of the integration to the digital signal processing circuit 6, and which controls the aperture/shutter 3 in accordance with the integration result; and an AF integrating circuit 12 which receives the R, G, and B image signals that are output from the analog signal processing circuit 5, which integrates the color signals in order to perform an automatic focusing (AF) process, and which adjusts the focus position of the lens 2.

The digital camera of the embodiment further comprises a timing generator 13, and an applied voltage adjusting circuit 14. In accordance with a result of the integration of the AWB integrating circuit 10, the applied voltage adjusting circuit 14 adjusts an application voltage between a pixel electrode layer and an opposing electrode layer (which will be described later) of R and B pixels of the variable sensitivity imaging device 1, thereby adjusting the sensitivity of the variable sensitivity imaging device 1 itself. The timing generator 13 receives the result of the integration of the AE integrating circuit 11, and outputs a timing of driving the variable sensitivity imaging device 1 to the variable sensitivity imaging device 1, at a timing when it cooperates with the applied voltage adjusting circuit 14.

Figure 10:
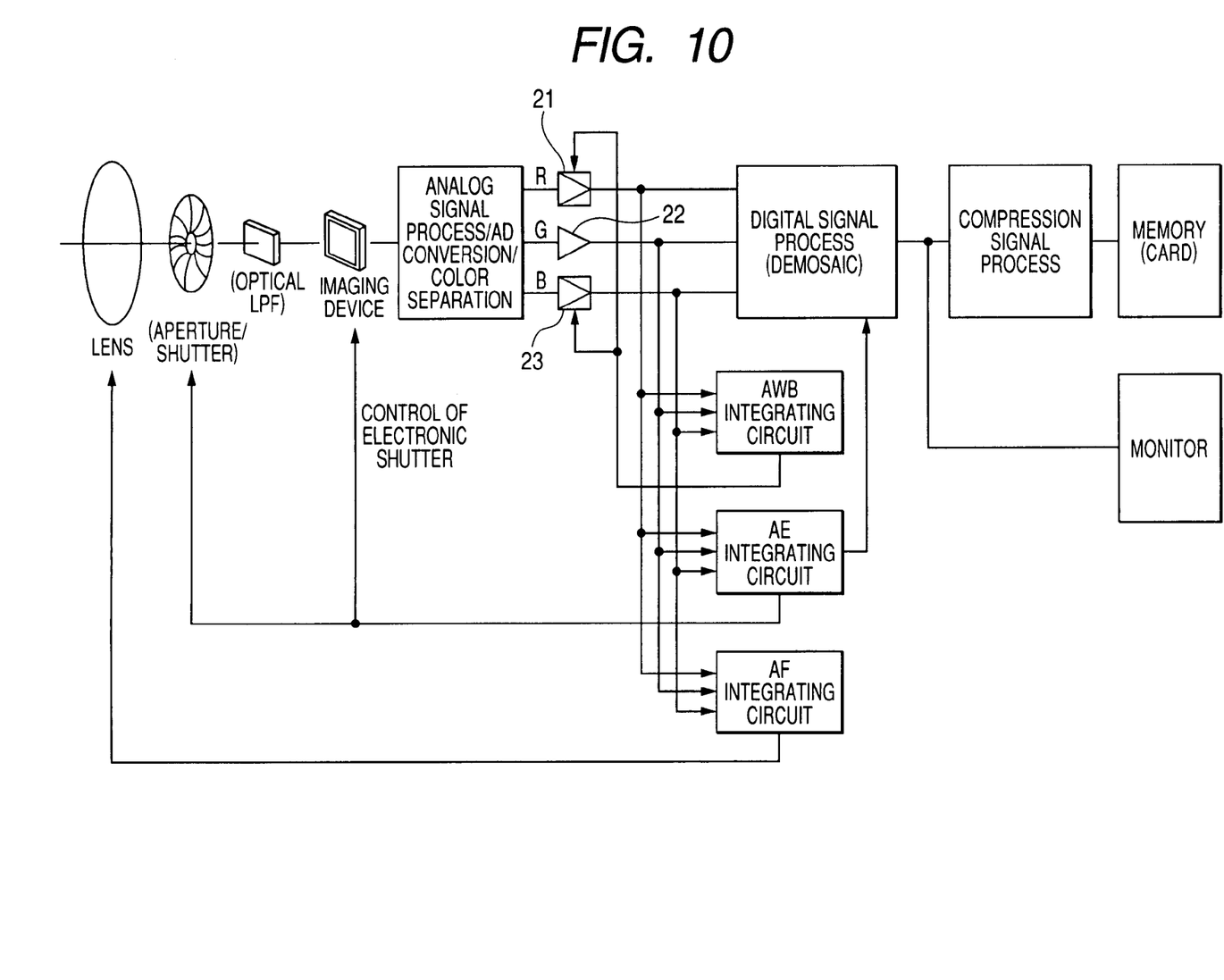
FIG. 10 is a functional block diagram of the related-art digital camera.

FIG. 10 is a functional block diagram of the related-art digital camera which is illustrated for comparison. The digital camera comprises an R-signal amplifier 21, a G-signal amplifier 22, and a B-signal amplifier 23 in a stage subsequent to an analog signal processing circuit. The amplification gains of the amplifiers 21, 23 are controlled in accordance with the integration result of the AWB integrating circuit, to attain the auto white balance. By contrast, the digital camera of the embodiment is configured so that, as described with reference to FIG. 1, the voltage to be applied to the variable sensitivity imaging device 1 itself is controlled in accordance with the integration result of the AWB integrating circuit 10, to attain the auto white balance.

Figure 2:
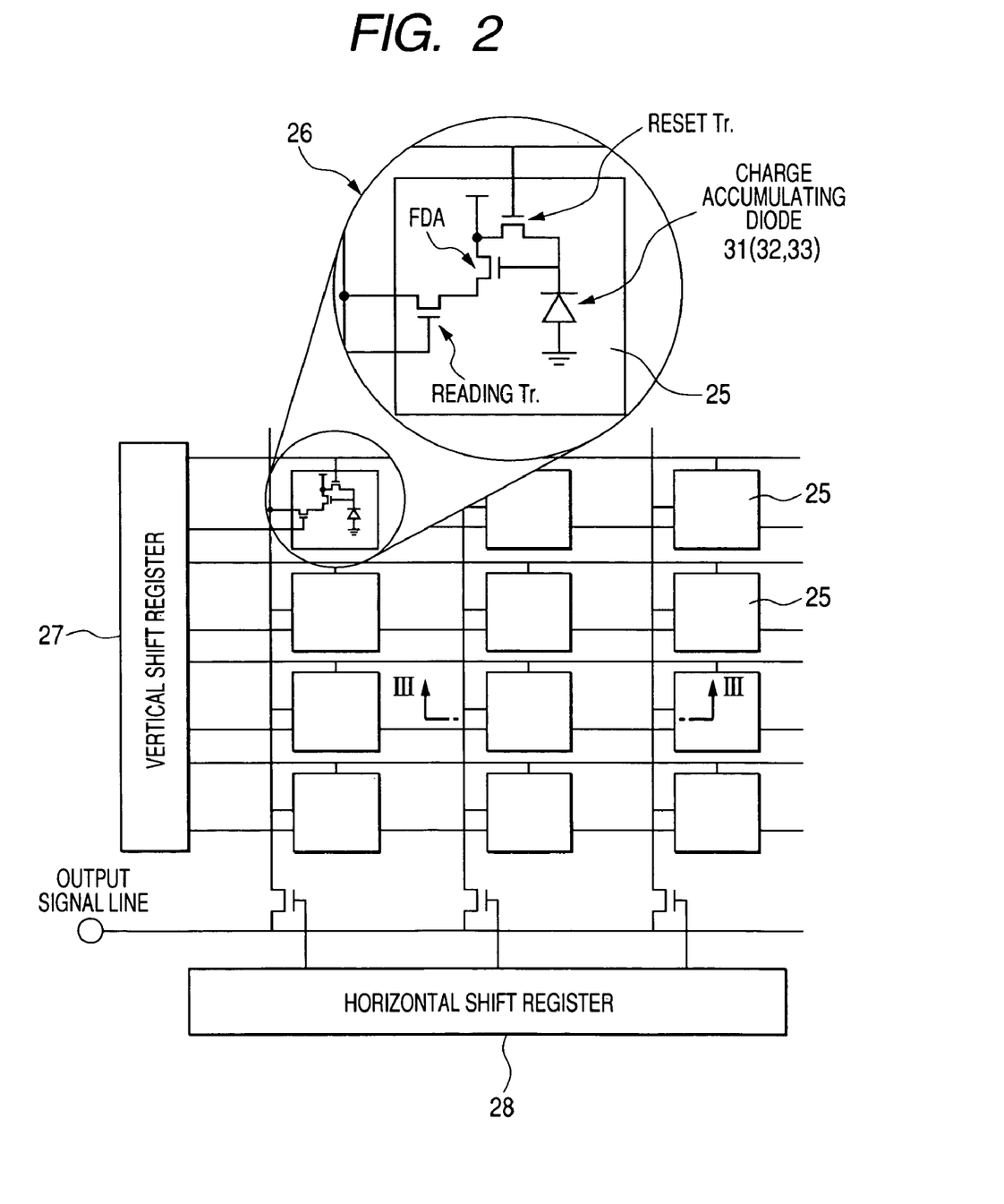
FIG. 2 is a partial surface diagram of a variable sensitivity imaging device of the embodiment of the invention.

FIG. 2 is a partial surface diagram of the variable sensitivity imaging device 1 of the embodiment. In the illustrated example, many pixels 25 are arranged in a square lattice pattern in the surface of the variable sensitivity imaging device 1. In a bottom portion of each of the pixels 25, signal read circuits 26 which read out the R, G, and B image signals corresponding to signal charges of R (red), G (green), and B (blue) detected by the pixel 25 are formed.

In the embodiment, signal read circuits of the three-transistor configuration which is used in a CMOS image sensor are illustrated as the signal read circuits 26. Alternatively, signal read circuits of the four-transistor configuration may be used. For each pixel, three signal read circuits 26 are disposed. When designated by a vertical shift register 27 and a horizontal shift register 28, the signal read circuits read out detection signals of R, G, and B to the analog signal processing circuit 5 (FIG. 1).

Figure 3A:
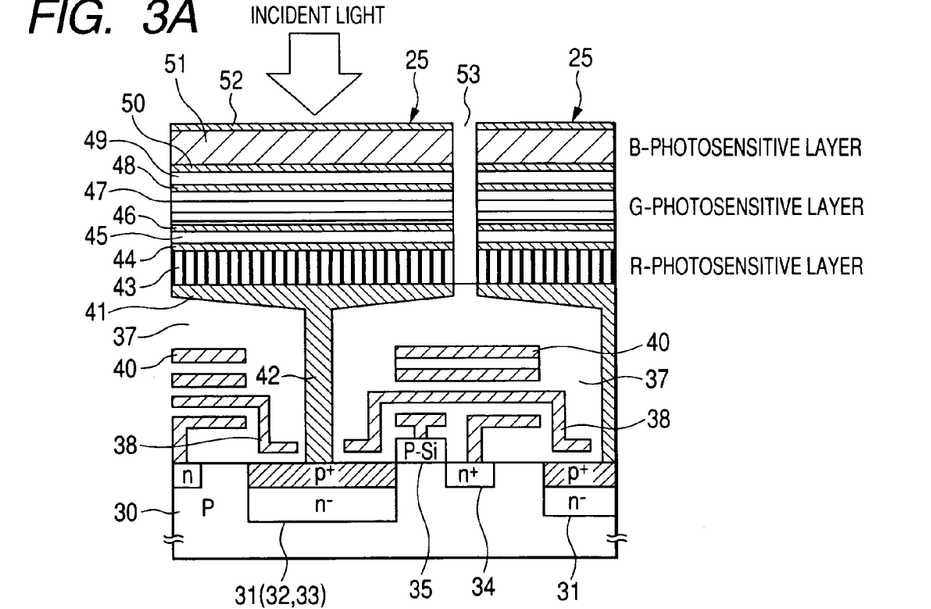
FIG. 3 is a section diagram taken along the line III-III in FIG. 2.

FIG. 3A is a section diagram taken along the line III-III in FIG. 2, and corresponds to a section of about 1.5 pixels. A diode portion 31 which is a signal charge accumulating region for red (R) is formed in a predetermined place of a surface portion of a semiconductor substrate 30, a diode portion (32) which is a signal charge accumulating region for green (G) is formed in a place inner than the diode portion 31 in the plane of the sheet, and a diode portion (33) which is a signal charge accumulating region for blue (B) is formed in a further inner place in the plane of the sheet.

An n-region 34 which constitutes a part of the transistors of the signal read circuits 26 is formed in the surface portion of the semiconductor substrate 30. When a read voltage is applied to a gate electrode 35 which is disposed via a surface oxide film (not shown) of the semiconductor substrate 30, accumulated charges in the diode portion 31 are moved to the n-region 34, and then read out to the outside of the variable sensitivity imaging device 1 by the signal read circuit.

As the signal read circuits 26, an R-signal reading circuit which reads out accumulated charges in the diode portion 31, a G-signal reading circuit which reads out accumulated charges in the diode portion 32, and a B-signal reading circuit which reads out accumulated charges in the diode portion 33 are disposed for each pixel. These signal read circuits 26 are light shielded by a light shielding film 38 which is embedded in an insulating layer 37 stacked on the surface of the semiconductor substrate 30. In the insulating layer 37, lines 40 through which the signal read circuits are connected to the vertical shift register 27 and the horizontal shift register 28 of FIG. 2 are laid above the light shielding film 38.

An R-pixel electrode layer 41 is stacked on the surface of the insulating layer 37, and a longitudinal line 42 through which the R-pixel electrode layer 41 is connected to the diode portion 31 is longitudinally formed. A photosensitive layer (photoelectric converting layer) 43 having a sensitivity at red light is stacked on the R-pixel electrode layer 41, and a transparent opposing electrode layer 44 is stacked on the photosensitive layer.

Figure 3B:
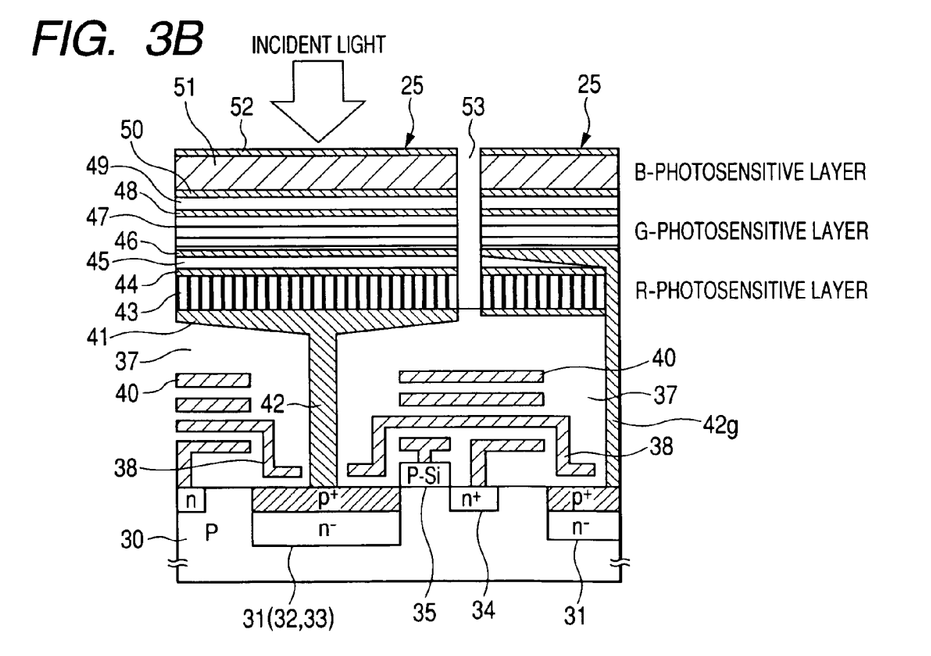

A transparent insulating layer 45 is stacked on the opposing electrode layer 44, and a transparent G-pixel electrode layer 46 is stacked on the insulating layer. A longitudinal line (a portion inner than the longitudinal line 42 in the plane of the sheet: see the reference numeral 42g in the right side of FIG. 3B) which is not shown, and through which the G-pixel electrode layer 46 is connected to the G-diode portion 32 is longitudinally formed. A photosensitive layer (photoelectric converting layer) 47 having a sensitivity at green light is stacked on the G-pixel electrode layer 46, and a transparent opposing electrode layer 48 is stacked on the photosensitive layer.

A transparent insulating layer 49 is stacked on the opposing electrode layer 48, and a transparent B-pixel electrode layer 50 is stacked on the insulating layer. A longitudinal line (a portion which is further inner than the longitudinal line 42 in the plane of the sheet) which is not shown, and through which the B-pixel electrode layer 50 is connected to the B-diode portion 33 is longitudinally formed. A photosensitive layer (photoelectric converting layer) 51 having a sensitivity at blue light is stacked on the B-pixel electrode layer 50, and a transparent opposing electrode layer 52 is stacked on the photosensitive layer.

The R-longitudinal line 42, the G-longitudinal line, and the B-longitudinal line connect the corresponding diode portions to the pixel electrode layers, respectively, and are electrically insulated from the other members. A transparent protective film (not shown) is stacked on the opposing electrode layer 52.

When light from an object is incident on the thus configured variable sensitivity imaging device 1, light in the wavelength region of blue in the incident light is absorbed by the B-photosensitive layer 51, hole-electron pairs corresponding to the amount of the absorbed light are generated, and the electrons in the pairs are flown into the B-diode portion 33 from the B-pixel electrode layer 50 through the longitudinal line to be accumulated therein.

Similarly, light in the wavelength region of green in the incident light is absorbed by the G-photosensitive layer 47, hole-electron pairs corresponding to the amount of the absorbed light are generated, and the electrons in the pairs are flown into the G-diode portion 32 from the G-pixel electrode layer 46 through the longitudinal line to be accumulated therein.

Similarly, light in the wavelength region of red in the incident light is absorbed by the R-photosensitive layer 43, hole-electron pairs corresponding to the amount of the absorbed light are generated, and the electrons in the pairs are flown into the diode portion 31 from the R-pixel electrode layer 41 through the longitudinal line 42 to be accumulated therein.

Hole-electron pairs which are generated in a photosensitive layer as a result of light incidence sometimes recombine with each other in the photosensitive layer. In the imaging device of the embodiment, therefore, a line serving as a section for applying a voltage between a pixel electrode layer and an opposing electrode layer is disposed (this line may be disposed in any manner as far as a desired control voltage can be applied between the pixel electrode layer and the opposing electrode layer), and, through the line, the applied voltage adjusting circuit 14 shown in FIG. 1 adjusts an applied voltage, and controls a potential gradient in the photosensitive layer between the pixel electrode layer and the opposing electrode layer.

According to the configuration, ionized electrons of hole-electron pairs are rapidly moved to the pixel electrode layer and holes to the opposing electrode layer, recombination of hole-electron pairs is suppressed, and the sensitivity of the imaging device can be adjusted by controlling the potential gradient.

Figure 4:
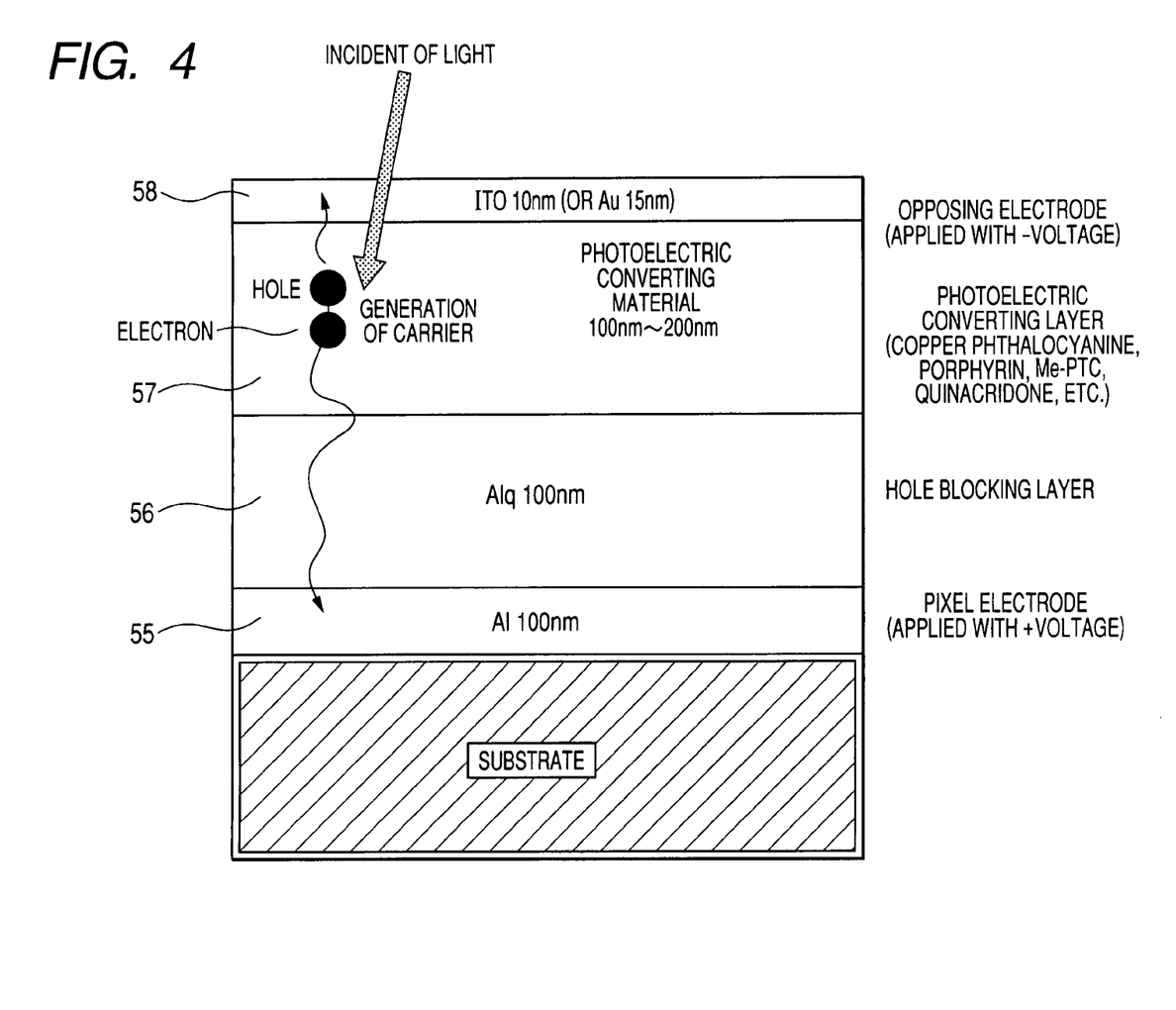
FIG. 4 is a diagram illustrating an imaging device of a photosensitive layer (photoelectric converting film) stack type.

FIG. 4 is a section diagram of a case where only one photosensitive layer is stacked on an opaque substrate. In the diagram of FIG. 3, the structure in which each photosensitive layer is interposed between a pixel electrode layer and an opposing electrode layer is illustrated. Preferably, each photosensitive layer is configured as illustrated in FIG. 4.

A hole blocking layer 56 is formed by Alq on a pixel electrode layer 55 made by thin aluminum. On the layer, a photoelectric converting material is stacked to be formed as a photosensitive layer 57, and a transparent opposing electrode layer 58 is formed by ITO or Au on the photosensitive layer.

Each of films of aluminum, the photoelectric converting material, and Alq can be formed by vacuum evaporation. Preferably, the degree of vacuum is about $10^{-4}$ Pa. When a voltage is applied between a pixel electrode layer and an opposing electrode layer, a large dark current due to, particularly, injection of holes flows. Therefore, Alq is required as a hole blocking layer.

While preventing injection of holes from the electrode 55 from occurring, the hole blocking layer functions to receive electron carriers generated in the photosensitive layer (photoelectric converting layer) 57, and transport the electron carriers to the electrode 55. Although small, the hole blocking layer has a sensitivity.

The opposing electrode layer (ITO, Au, or the like) 58 can be formed by sputtering, electron beam evaporation, ion plating, or the like. In the case where an organic layer is used as the photosensitive layer 57, when the ITO 58 is formed on the organic layer 57, usually, the yield is very impaired by a short circuit. When the thickness is less than about 10 nm, the yield is improved.

In the case where the organic layer is largely damaged, preferably, a thin film of gold (Au) is used as the opposing electrode layer 58 although the light transmittance is lower as compared with ITO. Also in this case, preferably, the thickness is less than about 15 nm.

When the photosensitive layer 57 has a thickness of about 100 nm, also reflection from the aluminum electrode layer 55 exists, and 90 to 99% of incident light can be absorbed. The voltage applied between the pixel electrode layer 55 and the opposing electrode layer 58 is usually about 1 to 30 V. At about 15 V, the external quantum efficiency at the maximum absorbance wavelength is about 20 to 40%. When the voltage is further raised, the quantum efficiency is enhanced, but the dark current due to injection of holes from the electrode 55 is increased, so that the S/N is impaired.

The photosensitive layer 57 made of an organic material is deteriorated by oxygen or water. Therefore, a sealing layer of silicon nitride or the like is necessary on the opposing electrode layer 58 (in FIG. 3, the opposing electrode layer 52). In this case, the sealing layer may be formed by low-damage sputter, low-damage plasma CVD, or the like so as not to damage the device.

Figure 5:
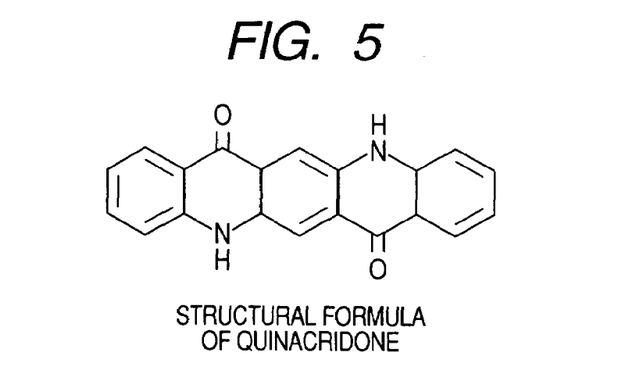
FIG. 5 is a view showing the structural formula of quinacridone which is an example of the material used as a photosensitive layer.

Examples of the material of the photosensitive layer 57 are copper phthalocyanine, porphyrin, Me-PTC, and quinacridone. The characteristic of quinacridone will be described as one example. FIG. 5 shows the structural formula of quinacridone, and FIG. 6 is a graph showing the spectral sensitivity characteristic of quinacridone.

Figure 6:
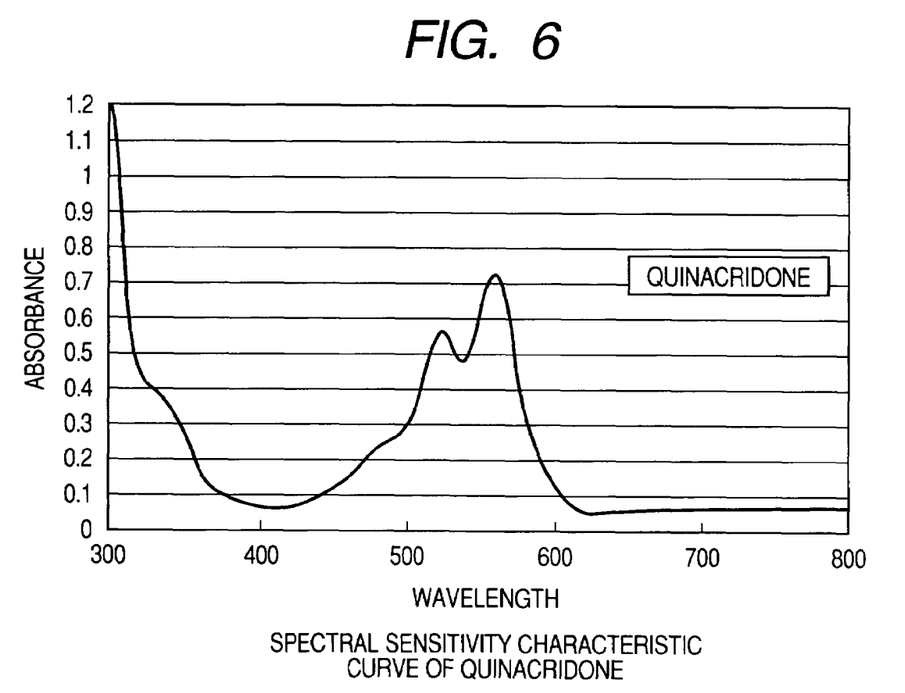
FIG. 6 is a graph showing the spectral characteristic of quinacridone.

According to FIG. 6, quinacridone has a spectral characteristic which is similar to the human visual sensitivity characteristic, and hence can be used as a monochrome photosensitive layer, or as a photosensitive layer for green (G). Quinacridone has a sensitivity peak also in the short wavelength side. The lens 2 (see FIG. 1, more correctly glass used in the lens) has a function of absorbing short-wavelength light, and hence coating is applied as required to the lens 2 and the like. Therefore, the peak of the short wavelength side can be easily eliminated, and hence there arises no problem.

Figure 7:
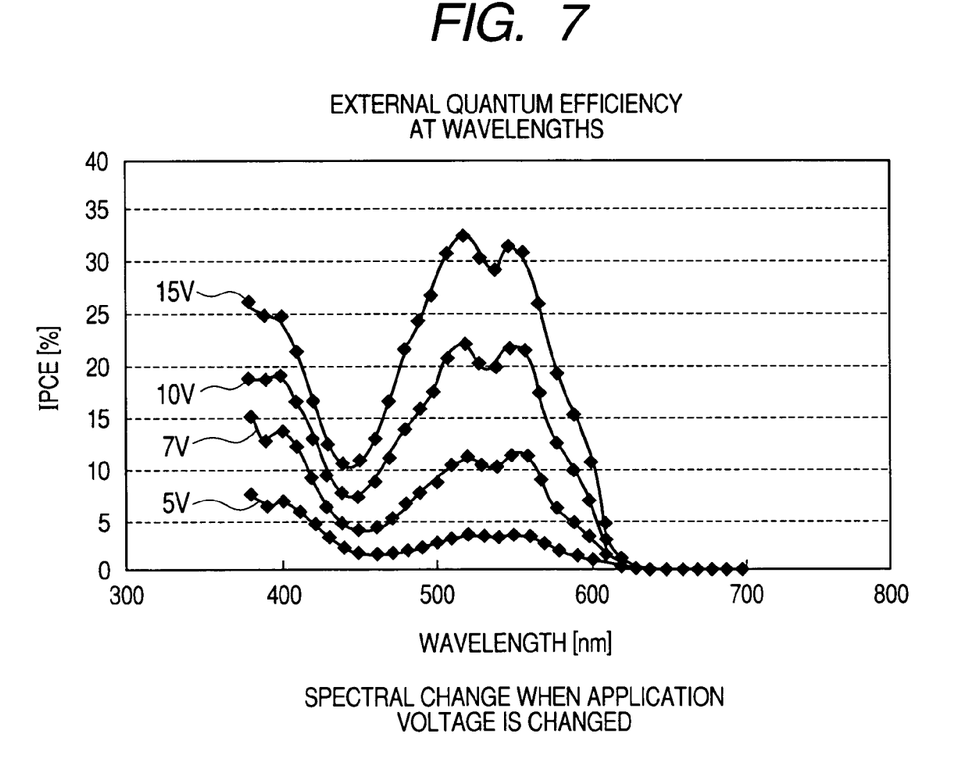
FIG. 7 is a graph showing changes of the spectral characteristic when a voltage applied to the photosensitive layer is changed.
Figure 8:
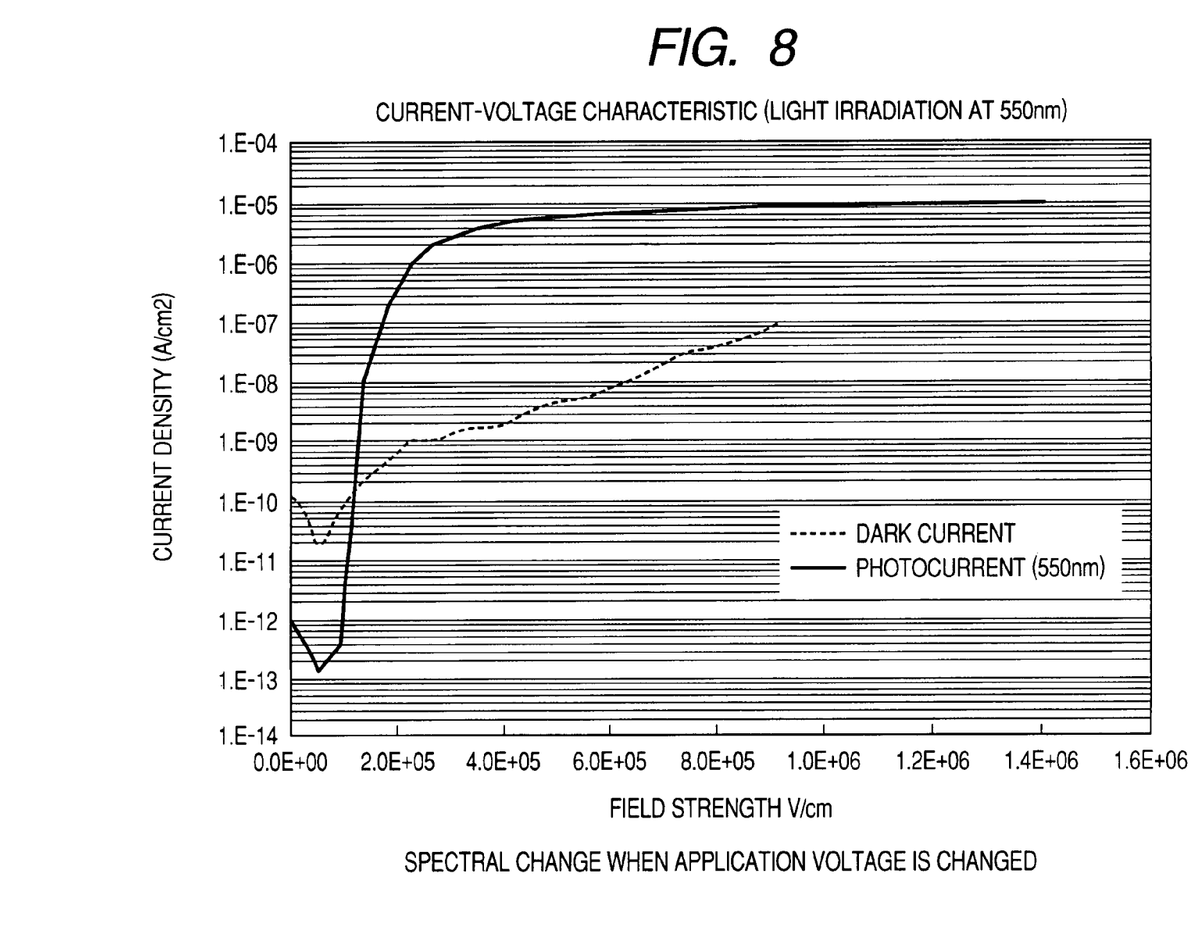
FIG. 8 is a graph showing the current-voltage characteristic in the case where the wavelength is 550 nm in FIG. 7.

In the photosensitive layer, when the voltage to be applied between the pixel electrode layer and the opposing electrode layer is changed, the spectral sensitivity characteristic is changed. FIG. 7 is a graph which shows changes of the spectral sensitivity, and in which the abscissa indicates the wavelength, and FIG. 8 is a graph showing the current-voltage characteristic in the case where the wavelength is fixed to 550 nm. In FIG. 8, "voltage" is indicated by a field strength (applied voltage/thickness), and "current" is indicated by a current density per square cm.

As seen from FIG. 8, there is a linearity between the voltage and the current in the ranges where the current density is between $1E^{-11}$ to $1E^{-8}$, and where the field strength is equal to or higher than $4E^{+5}$. When these regions are used, or the portion where there is a linearity in the current-voltage characteristic of the material is utilized, the gain control is further facilitated.

Figure 9:
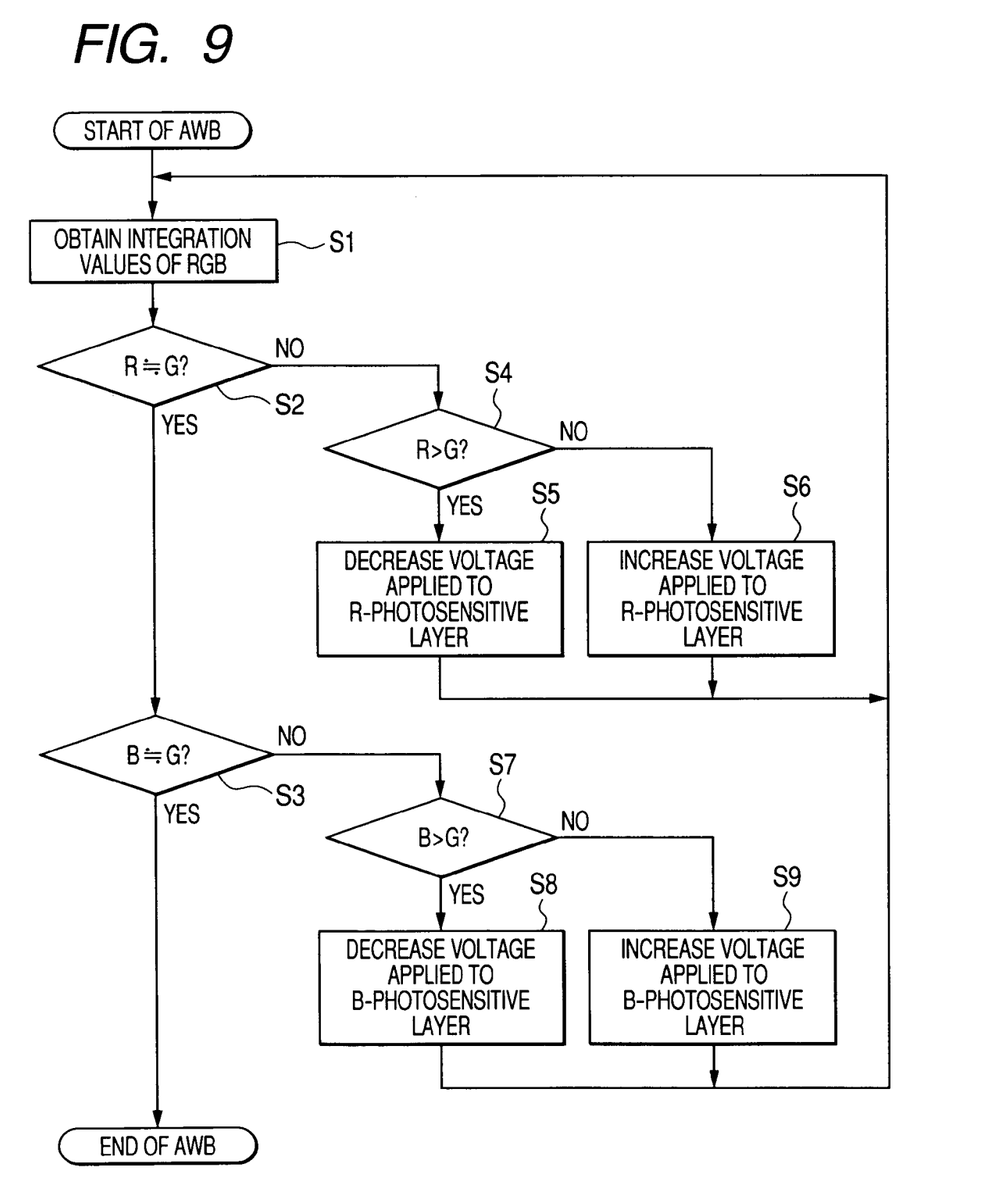
FIG. 9 is a flowchart showing the procedure of an auto white balance process which is executed by the digital camera shown in FIG. 1.

FIG. 9 is a flowchart showing the procedure of the auto white balance (AWB) process which is executed by the digital camera of the embodiment. When the AWB process is started, the AWB integrating circuit 10 first integrates the R, G, and B image signals to obtain a result of the integration (step S1). Next, it is determined whether the integration value of R is equal to that of G in a predetermined range or not (step S2). If the result relating to the range is affirmative, the control proceeds to next step S3, and it is determined whether the integration value of B is equal to that of G in a predetermined range or not. If the result of the decision is affirmative, the AWB process is ended.

In the case where a color image is photographed, usually, it is assumed in any scene that the image contains the same amounts of red (R), green (G), and blue (B). If the results of steps S2 and S3 are affirmative (R≅G≅B), therefore, it can be determined that a color image which satisfies the assumption is photographed. In the AWB process, the adjustment control by the applied voltage adjusting circuit 14 is not performed.

If the result of the decision of step S2 is negative, the control proceeds from step S2 to step S4, and it is determined whether the integration value of R>the integration value of G is established or not. If established, it is determined that the sensitivity for red is excessively high, and the control proceeds to step S5. The voltage to be applied between the pixel electrode layer 41 and the opposing electrode layer 44 of the R-photosensitive layer 43 is decreased. Then, the control returns to step S1. Namely, a feedback control is performed, and the sensitivity is adjusted in real time (this is applicable in the following description).

If the result of the decision of step S4 is negative, or the integration value of red in the color image is considerably smaller than that of green, it is determined that the sensitivity for red is excessively low, and the control proceeds to step S6. The voltage to be applied between the pixel electrode layer 41 and the opposing electrode layer 44 of the R-photosensitive layer 43 is increased. Then, the control returns to step S1.

If the result of the decision of step S3 is negative, the control proceeds from step S3 to step S7, and it is determined whether the integration value of B>the integration value of G is established or not. If established, it is determined that the sensitivity for blue is excessively high, and the control proceeds to step S8. The voltage to be applied between the pixel electrode layer 50 and the opposing electrode layer 52 of the B-photosensitive layer 51 is decreased. Then, the control returns to step S1.

If the result of the decision of step S7 is negative, or the integration value of blue in the color image is considerably smaller than that of green, it is determined that the sensitivity for blue is excessively low, and the control proceeds to step S9. The voltage to be applied between the pixel electrode layer 50 and the opposing electrode layer 52 of the B-photosensitive layer 51 is increased. Then, the control returns to step S1.

As a result, in the digital camera which is equipped with the variable sensitivity imaging device 1 of the embodiment, the sensitivities of the red, green, and blue pixels (partial pixels for the colors in one pixel 25 of FIG. 2) can be controlled so as to be substantially uniform, and it is possible to photograph an excellent color image.

When a dark scene in which the whole amount of incident light is small is to be photographed, an operation switch (not shown) of the digital camera is operated so as to increase the ISO sensitivity. As a result, the voltages to be applied between the pixel electrode layer and the opposing electrode layer in the pixels are increased as a whole, and the rate of extinction due to recombination of hole-electron pairs generated in each photosensitive layer is reduced, so that it is possible to photograph a bright and low-noise image.

In the variable sensitivity imaging device of the above-described embodiment, the signal read circuits of the three-or four-transistor configuration which is employed in the related-art CMOS image sensor are used as the signal reading section. Alternatively, a charge transfer path configured by a register which is employed in the related-art CCD image sensor may be used as the signal reading section. The signal charge accumulating portions are configured by the diodes. Alternatively, the signal charge accumulating portions may be configured by capacitors.

In the digital camera in the above-described embodiment, the shutter 3 is disposed. The shutter is used in order merely to decide the temporal simultaneity of a photographed image. Depending on the configuration of a variable sensitivity imaging device, a shutter is not always necessary. For example, a shutter is not essential when a CMOS variable sensitivity imaging device having a mechanism which is called a global shutter, and in which photo-charges can be temporarily accumulated is configured, or when a CCD variable sensitivity imaging device in which simultaneous reading is enabled is configured.

In the above-described embodiment, the variable sensitivity imaging device has a configuration in which the photosensitive layers are stacked above the semiconductor substrate. Alternatively, the signal reading circuits may be formed by using a technique in which, in place of a semiconductor substrate, a flexible sheet formed by a material such as PET (polyethylene terephtalate) is used as a substrate, and, for example, a TFT matrix of a liquid crystal substrate such as disclosed in JP-A-5-158070 is produced on the surface portion of the substrate, or a technique in which organic EL devices are produced on such a substrate.

According to the invention, the sensitivity of the imaging device can be variably controlled, and photographing of an excellent image is enabled. Furthermore, the sensitivity can be optimumly adjusted for each color. Therefore, photographing of a color image in which the white balance is excellent is enabled.

According to the variable sensitivity imaging device of the invention, the sensitivity of the imaging device itself can be variably controlled, and hence photographing of an excellent image is enabled. Therefore, the variable sensitivity imaging device is useful as an imaging device to be mounted on a digital camera which takes a motion picture or a still picture, such as a digital video camera or a digital still camera.

The entire disclosure of each and every foreign patent application from which the benefit of foreign priority has been claimed in the present application is incorporated herein by reference, as if fully set forth.

What is claimed is:

1. A variable sensitivity imaging device comprising:
   a substrate;
   a first photosensitive structure comprising:
      a first pixel electrode layer;
      a first opposing electrode layer; and
      a first photosensitive layer that is stacked above the substrate, and that is interposed between the first pixel electrode layer and the first opposing electrode layer;
   a second photosensitive structure comprising:
      a second pixel electrode layer;
      a second opposing electrode layer; and
      a second photosensitive layer that is stacked above the substrate, and that is interposed between the second pixel electrode layer and the second opposing electrode layer;
   a signal reading section, formed on said substrate, that reads a first signal corresponding to photo-charges that are generated in the first photosensitive structure by incidence of light and a second signal corresponding to photo-charges that are generated in the second photosensitive structure by the incidence of light; and
   a voltage applying section that applies a first voltage between the first pixel electrode layer and the first opposing electrode of the first photosensitive structure, and a second voltage between the second pixel electrode layer and the second opposing electrode of the second photosensitive structure,
   wherein the first photosensitive layer of the first photosensitive structure is stacked above the second photosensitive layer of the second photosensitive structure, and
   wherein the first voltage is higher or lower than the second voltage.

2. A variable sensitivity imaging device according to claim 1, wherein the first photosensitive layer of the first photosensitive structure has a peak of a photo sensitivity in wavelength from that of the second photosensitive structure.

3. A variable sensitivity imaging device according to claim 2, further comprising:
   a third photosensitive structure comprising:
      a third pixel electrode layer;
      a third opposing electrode layer; and
      a third photosensitive layer that is stacked above the substrate, and that is interposed between a third pixel electrode layer and the third opposing electrode layer,
   wherein a first one of the first photosensitive structure, the second photosensitive structure, and the third photosensitive structure has a photo sensitivity at red light,
   wherein a second one of the first photosensitive structure, the second photosensitive structure, and the third photosensitive structure has a photo sensitivity at green light, and
   wherein a third one of the first photosensitive structure, the second photosensitive structure, and the third photosensitive structure has a photo sensitivity at blue light.

4. An imaging apparatus comprising:
   the variable sensitivity imaging device according to claim 3; and
   an applied voltage adjusting section that respectively adjusts the first voltage, the second voltage, and a third voltage to adjust image signals of red, green, and blue that are output from the variable sensitivity imaging device, and perform white balance adjustment.

5. A variable sensitivity imaging device according to claim 1,
   wherein the substrate comprises a semiconductor substrate, and
   wherein the signal reading section comprises:
      a device having a charge transferring portion that transfers the photo-charges of a pixel at a predetermined position; or
      a device having a reading mechanism that selectively reads a signal corresponding to the photo-charges of the pixel at the predetermined position.

6. A variable sensitivity imaging device according to claim 1, wherein the substrate is flexible.

7. An imaging apparatus comprising:
   the variable sensitivity imaging device according to claim 1; and
   an applied voltage adjusting section that respectively adjusts the first voltage and the second voltage to adjust image signals output from the variable sensitivity imaging device.

* * * * *